United States Patent [19]

Ross et al.

[11] 4,113,577

[45] Sep. 12, 1978

[54] METHOD FOR PLATING SEMICONDUCTOR CHIP HEADERS

[75] Inventors: John P. Ross, Cupertino; Carl E. Bernardi, San Jose, both of Calif.

[73] Assignee: National Semiconductor Corporation, Santa Clara, Calif.

[21] Appl. No.: 776,162

[22] Filed: Mar. 10, 1977

Related U.S. Application Data

[62] Division of Ser. No. 619,368, Oct. 3, 1975, Pat. No. 4,032,422.

[51] Int. Cl.² .............................................. C25D 5/08
[52] U.S. Cl. ..................................................... 204/15
[58] Field of Search ................... 204/15, 224 R, 129.6

[56] References Cited

U.S. PATENT DOCUMENTS

| | | | |
|---|---|---|---|
| 2,532,907 | 12/1950 | Hangosky | 204/129.6 |
| 2,749,300 | 6/1956 | Thomas | 204/200 |
| 3,897,323 | 7/1975 | Schlotthauer | 204/224 R |
| 4,007,097 | 2/1977 | Noz | 204/15 |

*Primary Examiner*—T. M. Tufariello
*Attorney, Agent, or Firm*—Gail W. Woodward

[57] ABSTRACT

A method and apparatus for selectively plating the die-attach area of a semiconductor chip header are described. The apparatus comprises a rotary disc assembly. In the assembly there is provided a plurality of cavities for removably receiving individual headers. In each cavity there is provided an annular masking member for masking a header situated therein. Associated with each cavity, there is provided a cam-operated clamping means for clamping a header against the masking member and for coupling a source of potential to the header. Also associated with each cavity is a fluid jet for jetting a plating fluid against the header through a hole in the center of the sealing member. Plating fluid is selectively pumped, by means of a pumping means, to each of the jets along a plurality of fluid passageways from a fluid manifold. The fluid manifold is adapted to couple a predetermined number of the fluid passageways and jets to the pumping means as the disc assembly is rotated. Means are also provided for automatically releasing the clamping means and removing each header from the apparatus after completion of the plating operation.

3 Claims, 14 Drawing Figures

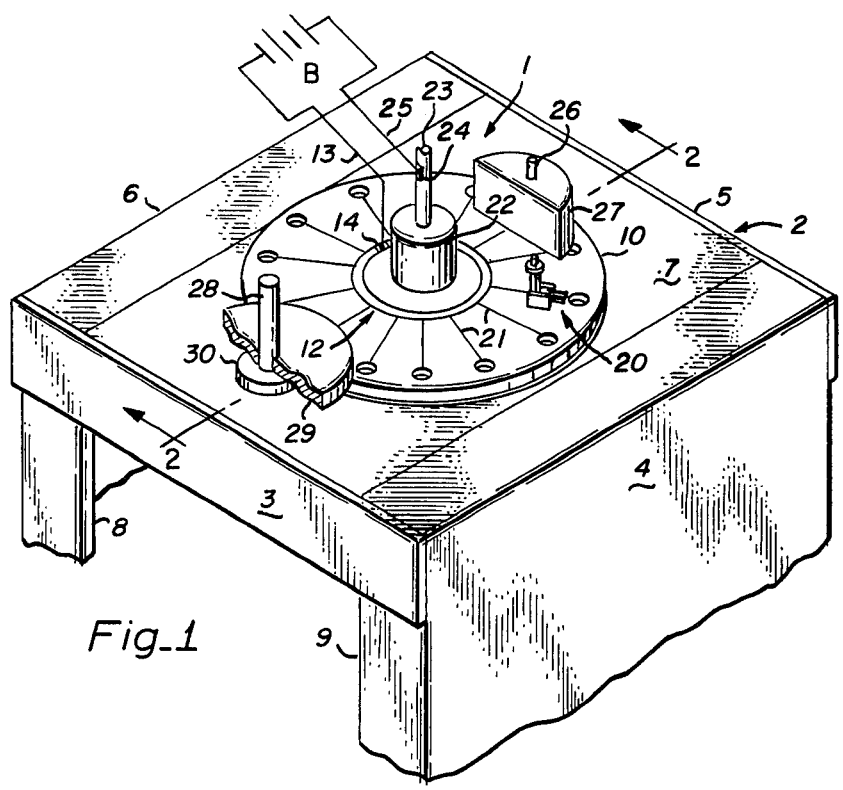
Fig_1
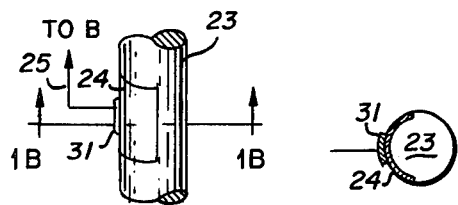
Fig_1A  Fig_1B
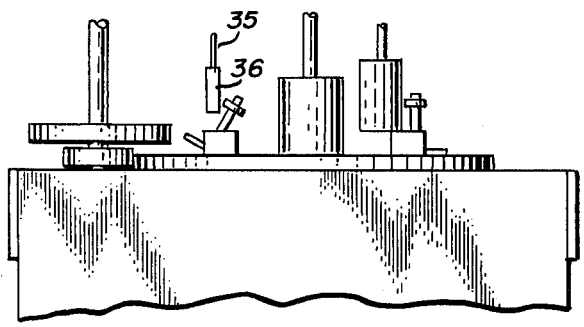
Fig_2

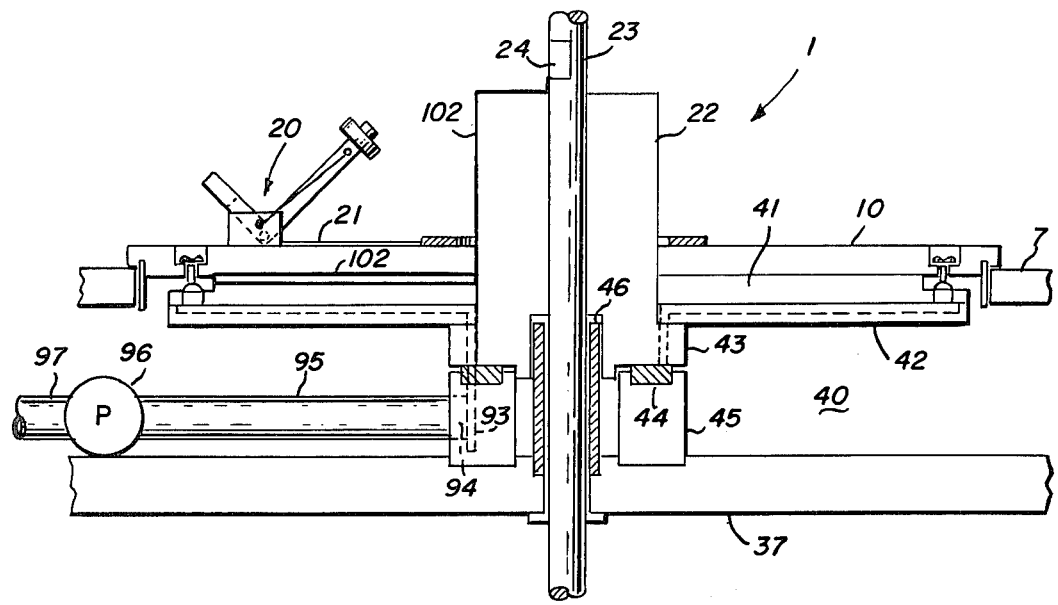
Fig_3
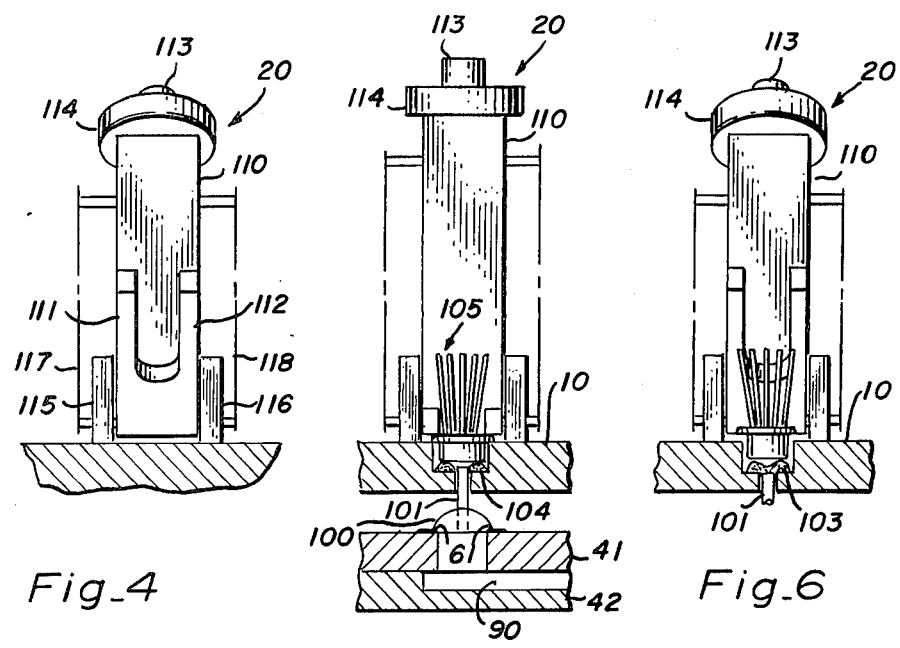
Fig_4
Fig_5
Fig_6

METHOD FOR PLATING SEMICONDUCTOR CHIP HEADERS

This is a division of application Ser. No. 619,368 filed October 3, 1975, now U.S. Pat. No. 4,032,422.

BACKGROUND OF THE INVENTION

The present invention is related to a method and apparatus for plating semiconductor chip headers in general and, in particular, to a method and apparatus for selectively plating the die-attach area of a header only.

The plating of the die-attach area of a semiconductor chip header typically requires the use of a precious metal, such as gold. In spite of the fact that the die-attach area extends over but a limited area of the top of a header, it has been the practice heretofore, to plate the entire header or at least a substantial part of its top and sides. Since only the die-attach area need be plated to satisfy current state-of-the-art technology, an obvious savings in precious metals is obtainable by restricting the use of such metals to that area.

SUMMARY OF THE INVENTION

In view of the foregoing, principal objects of the present invention are a method and apparatus for selectively plating the die-attach area of a semiconductor chip header.

In the apparatus there is provided a rotary disc assembly. In the upper surface of the assembly, there is provided a plurality of header receiving cavities. In each of the cavities there is provided an annular sealing member. Associated with each of the cavities is a cam-operated clamping member. The clamping member is provided for clamping a header in the cavity, coupling a source of potential between the header and a fluid jet associated therewith, and pressing the header against the sealing member. Centered relative to the hole in each of the sealing members is a fluid jet. Fluid for each of the jets is provided through a plurality of fluid passageways which extend radially from the center of the disc assembly. In the center of the disc assembly, there is provided a stationary fluid manifold. The manifold acts as a fluid valve and is adapted to connect a predetermined number of the fluid passageways to a source of plating fluid under pressure as the disc assembly is rotated. Means are also provided for automatically removing plated units from the holes so that the apparatus is usable in continuous plating operations.

DESCRIPTION OF THE DRAWINGS

The above and other objects of the present invention will become apparent upon a reading of the following detailed description of the accompanying drawings in which:

FIG. 1 is a partial perspective view of an apparatus according to the present invention.

FIG. 1A is a partial perspective view of a portion of the electrical circuit of the apparatus of FIG. 1.

FIG. 1B is a plan view of FIG. 1A.

FIG. 2 is an elevation view taken along lines 2—2 of FIG. 1.

FIG. 3 is a transverse cross-sectional view of the apparatus of FIG. 2.

FIG. 4 is an elevation view of one of the clamping assemblies of the present invention.

FIG. 5 is a cross-sectional view showing the position of the clamp of FIG. 4 relative to a header being plated.

FIG. 6 is an elevation view showing a header after release of the clamp of FIG. 5.

DETAILED DESCRIPTION

Figure 11:
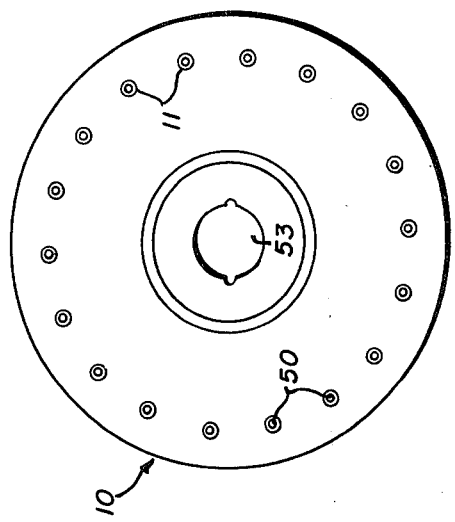
FIG. 11 is plan view of another of the disc members of the rotary disc assembly according to the present invention.

Referring to FIG. 1, there is provided in accordance with the present invention, a rotary disc assembly 1 mounted for rotation on a table 2. Table 2 is provided with a plurality of sidewalls 3, 4, 5 and 6, a top wall 7 and a pair of leg members 8 and 9. Leg members 8 and 9 are provided for supporting assembly 1 above a floor table or other supporting surface.

In assembly 1, there is provided a first circular disc member 10 having a plurality of cylindrical header-receiving cavities 11. Cavities 11 are equidistantly spaced apart and typically lie along a circular line near the periphery of the disc member. Interior of the cavities 11, there is provided a circular electrically conductive ring 12. In sliding contact with the ring 12 is an electrical contact 14. Contact 14 is adapted for coupling the ring 12, as by a wire 13, to the negative pole of a d.c. current source, such as a battery B. Pivotably mounted to member 10 between ring 12 and each of the cavities 11 is a spring-biased overcenter header clamping assembly 20, only one of which is shown. Each of the clamping assemblies 20 is electrically connected to the ring 12 as by a wire or the like 21.

In the center of assembly 1 is a spindle 22. Extending from the top of spindle 22 is a shaft 23. On shaft 23 there is provided an electrically conductive plate or pad 24 which is electrically connected to the positive pole of the source B as by a wire 25.

To the right of spindle 22, as shown in FIG. 1, and supported above member 10 as by a supporting rod 26 is a first camming member 27. To the left of spindle 22 and supported about the axis of a shaft 28 is a magnetic wheel or disc 29. Mounted on the shaft 28 below disc 29 is a roller 30. Roller 30 is driven by the disc member 10 for rotating the magnetic disc 29.

Referring to FIGS. 1A and 1B, the wire 25, coupled to source B, is electrically connected to the pad 24 mounted on shaft 23 as by a sliding contact 31. Pad 24 extends about the circumference of the shaft 23 for a predetermined distance for selectively electrically connecting and disconnecting the source B to and from a predetermined number of the clamping assemblies 20 of the assembly 1 as the shaft 23 is rotated.

Referring to FIG. 2, there is also supported above the disc member 10 as by a shaft 35, a second camming member 36. While omitted from FIGS. 1 and 2, it is understood that the upper end of the shafts 23, 26, 28 and 35 are supported in any suitable manner by an overhead supporting channel or the like; shafts 23 and 28 being rotatably supported such that shafts 23 and 28 are free to rotate and shafts 26 and 35 being fixedly supported such that members 27 and 36 are held in a stationary position relative to the member 10 as the member 10 is rotated.

Referring to FIG. 3, there is further provided in table 2, a bottom wall 37. Walls 3, 4, 5 and 6, described above with respect to FIG. 1, and wall 37 are joined in a fluid-tight manner for containing a plating fluid within a volume 40.

Above wall 37 and immediately adjacent to and below the first disc member 10 is a second disc member 41. Immediately adjacent to and below the second disc member 41 is a third disc member 42. For supporting the disc members 10, 41 and 42, spindle 22 is provided with a radially extending shoulder 43. Below spindle 22 and underlying shoulder 43 there is provided an annular ring-shaped member 44 supported on a cylindrically-shaped supporting member 45. Member 45 is supported on the bottom wall 37. Concentric with shaft 23, there is provided a bushing 46.

Figure 12:
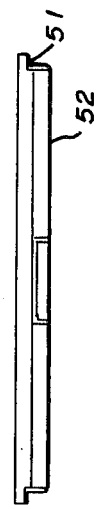
FIG. 12 is a cross-sectional view of the member of FIG. 11.

Referring to FIGS. 11 and 12, there is provided in each of the cavities 11 in disc member 10 a hole 50 having a diameter which is smaller than the diameter of the cavities. In the underside of the member 10 and extending about its periphery is a shoulder 51. Extending downwardly from the shoulder 51 at the interior edge thereof is a member for forming a fluid splash guard 52. The shoulder 51 is provided to extend over the top wall 7 and the member 52 is provided to extend beneath the wall 7. In the center of the disc member 10 there is provided a bore 53 for receiving the spindle 22.

Figure 9:
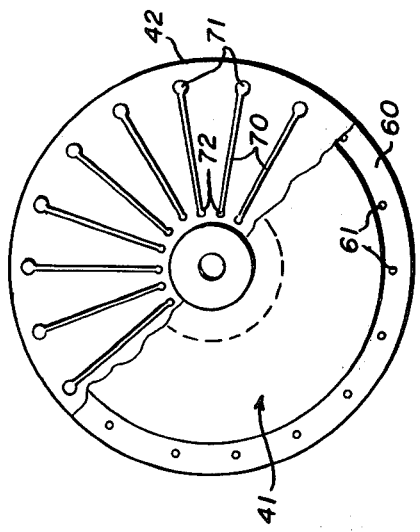
FIG. 9 is a plan view of one of the disc members of a rotary disc assembly according to the present invention.
Figure 10:
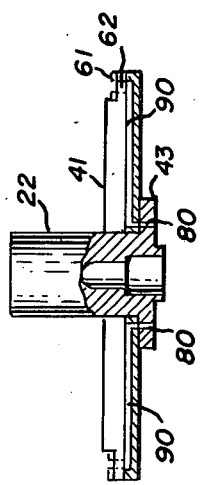
FIG. 10 is a cross-sectional view of the member of FIG. 9.

Referring to FIGS. 9 and 10, there is provided in the upper surface and extending about the periphery of second disc member 41, a shoulder 60. Fixed to the surface of shoulder 60 is an electrically conductive strip 61. Spaced about and extending through shoulder 60 and strip 61 for registration with holes 11 and 50 of first disc member 10 are a plurality of holes 62.

In third disc member 42 and extending radially in the upper surface thereof is provided a plurality of elongated cavities 70. Each of the cavities 70 is terminated at its outer end by an enlarged area 71. Each of the areas 71 is provided for registration with the holes 11 and 50 of first disc member 10 and the holes 62 of second disc member 41. At the interior end of each of cavities 70, there is provided a hole 72. In the shouldered portion 43 of spindle 22 there is provided for registration with each of the holes 72, a hole 80. In the center of each of the second and third disc members 41 and 42, there is further provided a spindle-receiving bore for receiving the spindle 22 such that, when second disc member 41 is placed on top of third disc member 42 and holes 72 placed in registration with holes 80 and enlarged areas 71 placed in registration with holes 62, there is formed a plurality of radially extending fluid passageways 90, each of which extends from the lower end of one of the holes 80 to the upper end of one of the holes 62.

Figure 7:
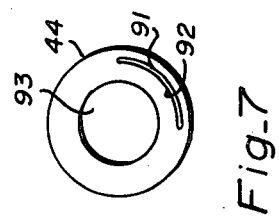
FIG. 7 is a plan view of a fluid manifold according to the present invention.
Figure 8:
FIG. 8 is a side view of FIG. 7.

Referring to FIGS. 7 and 8, there is provided in annular member 44 a cavity 91. In the base of cavity 91 there is provided, extending through the member 44, a hole 92. In the center of member 44, there is provided a bore 93 for receiving the spindle 22.

Referring again to FIG. 3, as previously described, member 44 is supported by the cylindrical supporting member 45. In the top of the body of member 45 is a recess for receiving the member 44 such that the upper surface of member 44 serves as a bearing surface for the spindle 22. Extending from the recess in the body of member 45, and positioned for registration with hole 92 of member 44, there is provided a hole 93. Extending from the hole 93 is another hole 94. Coupled to the hole 94 as by a pipe or the like 95, is the output of a fluid pump 96. The input of the pump 96 is coupled directly, or by means of a pipe or the like 97, to the volume 40 for pumping fluid from the volume.

Referring to the second disc member 41, as shown in FIG. 3, and to FIGS. 5 and 6, there is provided in each of the holes 62 a fluid jet 100 having an extended nozzle member 101. The lower end of jets 100 is typically screwed into the holes 62 such that the jet makes electrical contact with the strip 61. The strip 61 and hence each of the jets 100 are electrically coupled, as by a wire or the like 102, to the pad 24 on the shaft 23. The wire 102 typically runs from the strip 61 between the first and second disc members 10 and 41, along the outside of the spindle 22 and up the shaft 23 to the pad 24.

As shown in FIGS. 5 and 6, there is provided in each of the cavities 11 of first disc member 10, an annular resilient member 103 having a central hole 104. Member 103 is provided for masking off the die-attach area of a semiconductor chip header 105 when the header is pressed top down against the member. The top of the nozzle portion 101 of each of the jets 100 is provided to extend through the holes 50 of first disc member 10 and into the center hole 104 of the members 103.

In each of the clamping assemblies 20 associated with one of the cavities 11 first mentioned above with respect to FIG. 1, there is provided a vertically extending body member 110. Extending outwardly from and perpendicularly to the lower end of member 20 is a pair of spaced leg members 111 and 112. At the top of member 110 and rotatably attached thereto for rotation about a pin or the like 113 is a roller 114. Each of the assemblies 20 is pivotably attached to the first disc member 10 by means of a pair of spaced upstanding members 115 and 116. On opposite sides of member 110 there is provided a pair of spring members 117 and 118. Members 117 and 118 are attached at their top ends to the member 110 and at their bottom ends to the members 115 and 116 such that they function as an overcenter clamping assembly when pivoted between a first position, as shown in FIG. 4, and a second position, as shown in FIG. 5.

In operation, a plurality of headers, such as that represented by header 105 in FIGS. 5 and 6, are placed by hand or in any other suitable manner, in the cavities 11 of the first disc member 10. In practice, this is done while the assembly 1 is being rotated in a counter-clockwise direction looking from the top, as by a motor or the like (not shown) coupled to either end of the shaft 23. As the rollers 114 contact the first camming member 27, the clamping assemblies 20 are urged forwardly causing the leg members 111 and 112 to engage the top of a header, as shown in FIGS. 2 and 5, pressing the top of the header against the resilient masking member 103. At the same time, plating fluid which is placed intitially in the volume 40, is being pumped by pump 96 through the pipe 95, passageway 93 and hole 92 into the cavity 91 of annular member 44. Also at the same time, the electrically conductive pad 24 on shaft 23 is being rotated toward the electrical contact 31. At a predetermined time, after each of the headers is firmly pressed against its sealing member 103, and the spring members 117 and 118 of its overcenter clamping assembly 20 are positioned to hold the header in a fluid-tight seal therewith, the hole 80 in the lower end of the spindle 22 at the end of the passageway 90 associated with the header overrides the cavity 91 in member 44 and comes into fluid communication therewith. Simultaneously the electric contact 31 comes into sliding contact with electrical pad 24 such that there is then provided an electric field between the header and its associated fluid jet 100. As fluid flows from the cavity 91, through passageway 90 and its jet 100, a current flows in the fluid being jetted against the header, causing a plating metal to deposit on the unmasked surface of the header. The plating operation thus initiated continues as the assembly 1 is rotated until the contact 31 leaves the pad 24 and/or the hole 80 in the bottom of spindle 22 ceases to be in fluid communication with the cavity 91 in member 44.

Thereafter, the roller 114 comes into contact with the second camming member 36 and is urged rearwardly, releasing the header. As the assembly 1 continues to rotate, the leads of the header are contacted by the magnetic disc member 29 and the header removed. By any suitable means (not shown), the header is scraped or otherwise removed from the disc member 29 and deposited in a bin or the like for further processing.

Referring again to FIGS. 7 and 9, it can be seen that in the embodiment of member 44 described hereinabove, the length of cavity 91 is such that the cavity subtends an arc of approximately 90° and that at least five of the passageways 90 fall within the same angular displacement. It is, therefore, apparent that plating fluid is being jetted against at least five headers at all times and that more or less than that number can be plated simultaneously by adjusting the arc length of the cavity 91. If any change in the length of cavity 91 is made, however, a corresponding adjustment in the size and position of the electrical pad 24 relative to the electrical contact 31 may also be required.

It may be noted at this point that the switching of the source B by means of the use of pad 24 is simply for purposes of safety and that, if safety is not a consideration, the pad could be continuous and the switching of the source B eliminated.

As is conventional in most plating apparatus, the parts which come into contact with plating fluid are fabricated from well known materials which are compatible with the fluid such that the apparatus is not corroded and the fluid is free from contamination such as, for example, platinum for the electrical parts and any of several non-metallic materials for the non-electrical parts.

While a specific embodiment is described, it is understood that various changes and modifications in details and arrangements of the parts may be made within the spirit and scope of the present invention. Accordingly, it is intended that the scope of the invention be not limited to the embodiment described, but rather be determined according to the claims and their equivalents hereinafter provided.

What is claimed is:

1. A method of plating the die-attach area of a plurality of semiconductor chip headers comprising the steps of:
    placing each of said headers in an inverted position against a sealing member in a cavity of a rotating disc assembly;
    clamping said headers against said sealing member such that said sealing member forms a fluid-tight seal about said die-attach area;
    jetting a plating solution containing a plating material against said exposed areas; and
    causing a current to flow through said headers while said solution is being jetted against said exposed areas whereby plating material in said solution adheres to said exposed area; wherein said step of jetting comprises the step of jetting said solution against said die-attach area after said clamping of said headers and further wherein said step of causing a current to flow comprises the step of coupling a source of potential between a means for clamping said headers and a means for jetting said fluid against said die-attach areas such that said current will flow when said headers are contacted by said clamping means and said plating solution is flowing between said jetting means and said die-attach areas.

2. A method according to claim 1 wherein said step of clamping comprises the step of clamping said headers by means of a cam-operated pivotable over-center clamping means associated with each of said cavities.

3. A method according to claim 2 wherein said step of clamping said headers comprises the step of clamping said headers during a predetermined portion of each revolution of said rotating disc assembly and further wherein said step of jetting plating solution against said die-attach areas comprises the step of jetting said plating solution against said die-attach areas during said predetermined portion of each revolution of said rotating disc assembly.

* * * * *